United States Patent [19]

Slenker

[11] Patent Number: 5,339,065
[45] Date of Patent: Aug. 16, 1994

[54] ADJUSTABLE MICROELECTRONIC POTENTIOMETER

[76] Inventor: Stephen A. Slenker, 26 Cummings Rd., Tyngsboro, Mass. 01879

[21] Appl. No.: 75,036

[22] Filed: Jun. 10, 1993

[51] Int. Cl.$^5$ ............... H01C 10/16; H01C 10/38; H03H 7/25
[52] U.S. Cl. .................... 338/133; 338/177; 338/202; 338/322; 338/332; 333/81 R; 333/81 A
[58] Field of Search ............... 338/177, 133, 130, 180, 338/182, 190, 176, 202, 322, 323, 324, 325, 332; 333/81 A, 81 R, 81 B

[56] References Cited

U.S. PATENT DOCUMENTS

| | | | |
|---|---|---|---|
| 2,486,931 | 11/1949 | Edwards et al. | 338/176 X |
| 2,958,062 | 10/1960 | Barden et al. | 338/182 |
| 3,017,565 | 1/1962 | Carson et al. | 338/176 X |
| 3,184,694 | 5/1965 | Weinschel | 338/133 X |
| 3,617,976 | 11/1971 | Campbell | 338/133 |
| 3,626,352 | 12/1971 | McCoig | 338/190 |
| 3,634,805 | 1/1972 | Jestrzemski et al. | 338/180 |
| 3,657,691 | 4/1972 | Wilentchik | 338/182 |
| 3,750,078 | 7/1973 | Bruder | 338/150 |
| 3,851,293 | 11/1974 | Clayton | 338/195 |
| 3,890,589 | 6/1975 | Kogo et al. | 338/89 |
| 3,938,070 | 2/1976 | Koerner et al. | 338/60 |
| 3,944,962 | 3/1976 | Honda | 338/126 |
| 4,274,074 | 6/1981 | Sakamoto | 338/160 |
| 4,435,691 | 3/1984 | Ginn | 338/125 |

OTHER PUBLICATIONS

Variable Attenuators Type BT, Publication 5236, Jun., 1974, Allen-Bradley Corporation.

Primary Examiner—Marvin M. Lateef
Attorney, Agent, or Firm—Wolf, Greenfield & Sacks

[57] ABSTRACT

A miniature potentiometer suitable for mechanical adjustment of microwave circuits is provided. Furthermore, there is provided a dual, ganged potentiometer also suitable for mechanical adjustment of microwave circuits. The dual, ganged potentiometer provides reliable tracking of tapers between the two variable resistance elements. Yet further, there is provided a complete, microwave, T-pad attenuator circuit which is mechanically adjustable. The T-pad attenuator uses two ganged potentiometers, whose tapers track in a known non-linear fashion. The tapers may be logarithmic.

11 Claims, 7 Drawing Sheets

ADJUSTABLE MICROELECTRONIC POTENTIOMETER

BACKGROUND

1. Field of the Invention

The invention relates generally to electronic components and more particularly to variable resistive elements operable at microwave frequencies.

2. Discussion of Prior Art

Potentiometers, adjustable T-pad attenuators and numerous other applications of manually adjusted variable resistance elements are well known in audio frequency electrical arts and in radio frequency (RF) electrical arts. However, similar devices are unknown in microwave frequency arts. Yet, there exists a desire for manually adjusted resistive circuits in all of the electrical arts.

Variable resistance elements are typically bulky devices having large geometries entirely unsuitable for microwave applications. The problem of bulk and large geometry are essentially doubled when gang-adjustable variable resistance elements are required, such as in a T-pad attenuator circuit. One example of a gang-adjusted variable resistance element suitable for audio frequency application is the ALLEN-BRADLEY type BT Variable Attenuator. However, the type BT device is 0.5 inches in diameter and comprises two circular resistive elements coaxially arranged on a single shaft for adjustment. The large diameter of this unit results in a resistive element quite long with respect to microwave signal wavelengths. Therefore, the behavior of this unit at microwave frequencies would include transmission line effects, rendering it useless at those frequencies. For example, the characteristic impedance of the unit would be unacceptably high and would vary with frequency.

Mechanical constraints on a shaft-adjusted variable resistance element are such that a device usable in the microwave frequency range is impractical. For example, consider a single-turn design, based on a resistive element disposed along the circumference of a circle having a diameter of about 0.1 inches. In such a device, the resistive element is approximately 0.3 inches long. The length of the resistive element may cause a problem due to the resulting characteristic inductance of the unit. If two such devices are arranged back-to-back and gang-adjustable, such as in the audio unit described above, then inter-device interconnect lengths may be minimized. However, such a unit would have to be mounted in a vertical position which is highly likely to cause radiation or reception of noise. When the device is arranged so as to minimize its behavior as an antenna, for example by placing the device horizontally, interconnect lengths become long, causing inductance measured at microwave frequencies to be quite high. Also, even when arranged horizontally, one unit must be located directly above the other unit, and the upper unit behaves as an antenna.

The long interconnecting leads and the designs which do not take transmission line effects into account of the prior art result in extremely high standing wave ratios. Thus, the impedance of such devices vary with frequency to such a degree that the attenuation characteristics are useless at microwave frequencies.

Therefore, an adjustable miniature resistive element usable at microwave frequencies is desired. Furthermore, a miniature, dual, gang-adjustable resistive element usable at microwave frequencies is desired.

SUMMARY OF THE INVENTION

In accordance with one aspect of the present invention, there is provided a miniature potentiometer, suitable for use at microwave frequencies. The miniature potentiometer includes a substrate; a length of electrically resistive material having two ends and disposed on one side of the substrate, parallel to one edge of the substrate, a conductive stripe disposed on the other side of the substrate and parallel to the same edge; and a C-shaped sliding contact, slidably coupled to the substrate on the edge, so as to electrically connect a point along the length of electrically resistive material to a point along the conductive stripe.

In accordance with a second aspect of the present invention, there is provided a dual miniature potentiometer. The dual miniature potentiometer includes a substrate; two lengths of electrically resistive material disposed on one side of the substrate, parallel to each other and to one edge of the substrate; two conductive stripes disposed on another side of the substrate, parallel to each other and to the edge of the substrate; two C-shaped sliding contacts, slidably coupled to the substrate along two parallel edges such that one C-shaped sliding contact electrically connects a point along one of the lengths of electrically resistive material to a point along one of the pair of conductive stripes while the second C-shaped sliding contact electrically connects a point along the other of the lengths of electrically resistive material to a point along the other of the pair of conductive stripes; and the C-shaped sliding contacts mechanically connected one to the other by an electrically insulating connecting bar.

According to yet another aspect of the present invention, additional electronic components may be provided on a substrate such as described above. For example, potentiometers such as described above may be connected in various configurations by forming conductive regions on the substrate and interconnecting the potentiometers. Additional resistors may also be provided by forming additional lengths of resistive material. The lengths of resistive material may be trimmed, for example by laser, to very high degrees of accuracy. Furthermore, the adjustable resistive elements may be provided with a variety of different tapers. By employing a combination of the techniques noted, this aspect of the present invention may be used to construct useful circuit elements, such as T-pad attenuators.

These aspects of the present invention will be better understood in view of the figures and detailed description illustrating specific embodiments thereof.

DETAILED DESCRIPTION

Figure 1A:
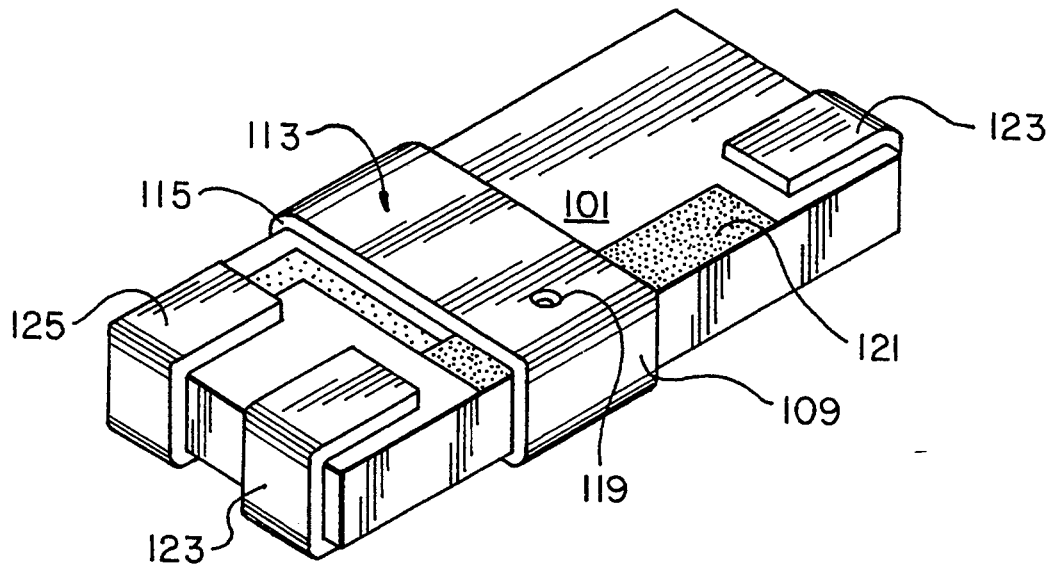
FIG. 1A is a top perspective view of an embodiment of the present invention.

The present invention will be better understood by reading the following description of some embodiments thereof in connection with the drawing.

Figure 1B:
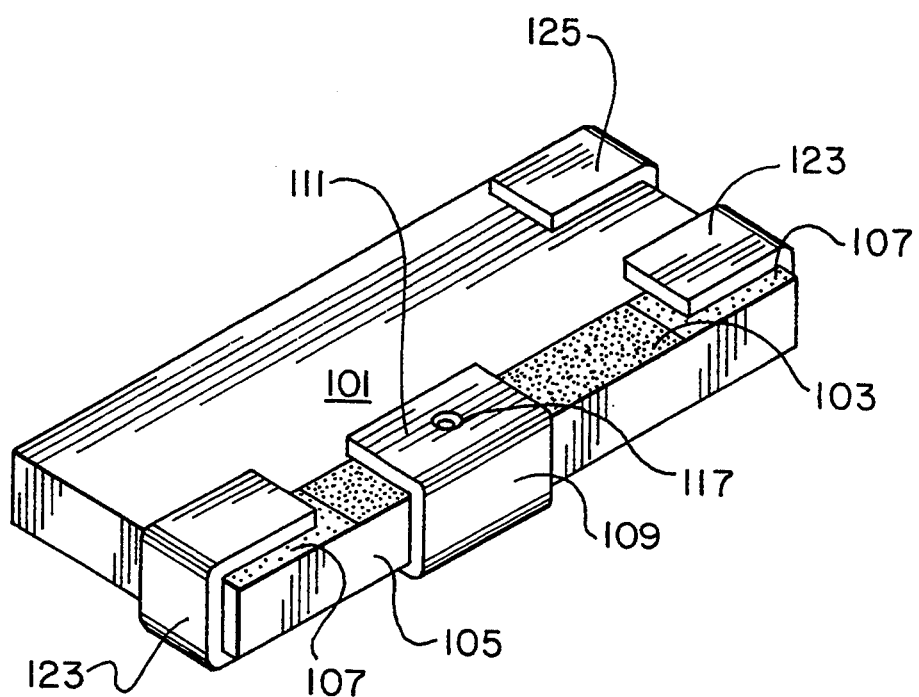
FIG. 1B is a bottom perspective view of the embodiment of FIG. 1A.

FIG. 1A shows a view of one side of a single adjustable, microelectronic resistive element, while FIG. 1B shows a view of the other side of the same component.

The device is constructed on a ceramic substrate 101. The particular ceramic used is a design choice made by those skilled in the art. Any ceramic or other microwave compatible material suitable for printing with thick-film resistive inks and suitable for receiving deposition of metal conductors may be used. The dimensions of the substrate 101 and the other various elements to be described below may vary considerably. However, for microwave frequency operation suitable dimensions for substrate 101 might be 0.3 inches×0.3 inches×0.02 inches.

Printed on one side of the substrate 101 is a region of resistive ink 103. The precise shape and dimensions of the region of resistive ink will depend upon several design choices and design goals, as discussed in connection with the various embodiments. For example, the embodiment of FIG. 1A illustrates the case where a linear variation in resistance is desired over the range of adjustment. Therefore in this embodiment, region of resistive ink 103 is rectangular in shape. It is disposed along a long edge 105 of substrate 101, and has a width calculated to give a desired overall resistance value when taken in combination with the length and type of resistive ink used. The precise size and shape of region of resistive ink 103 may be laser trimmed, so as to provide extremely accurate and predictable characteristics.

Resistive inks are well known in this art. They are characterized by their resistivity as measured in $\Omega/\square$, when printed on a substrate. Thus, it is a simple matter for those skilled in the art to calculate dimensions needed to give a particular resistance value by satisfying:

$$R(\Omega) = \frac{\sigma(\Omega/\square) \cdot l}{\omega};$$

where R is the desired resistance, $\sigma$ is the resistivity of the ink as printed, $l$ is the length of region of resistive ink 103 measured between electrical contacts thereto and $\omega$ is the width of region of resistive ink 103.

Electrical contact is made to opposite ends of region of resistive ink 103 by metal regions 107 deposited on substrate 101. Using conventional construction techniques, metal regions 107 would be deposited on substrate 101 before printing region of resistive ink 103. Thus, contact may be effected by printing resistive region 103 so as to slightly overlap metal regions 107. One suitable material for use in metal regions 107 is a vapor deposition layer of gold film. Other metals and construction techniques may also be used.

Figure 2A:
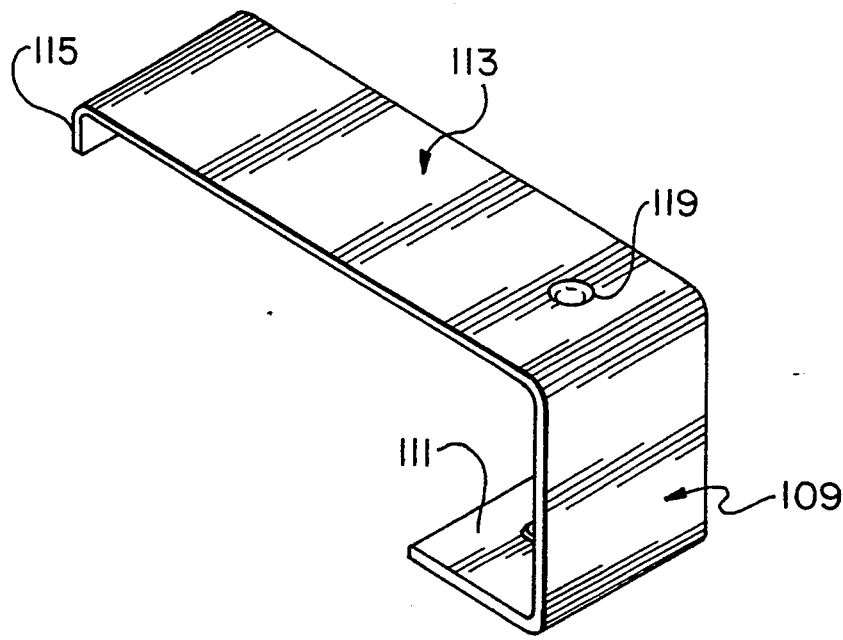
FIG. 2A is a top perspective view of a slidable contact of the embodiment of FIG. 1.
Figure 2B:
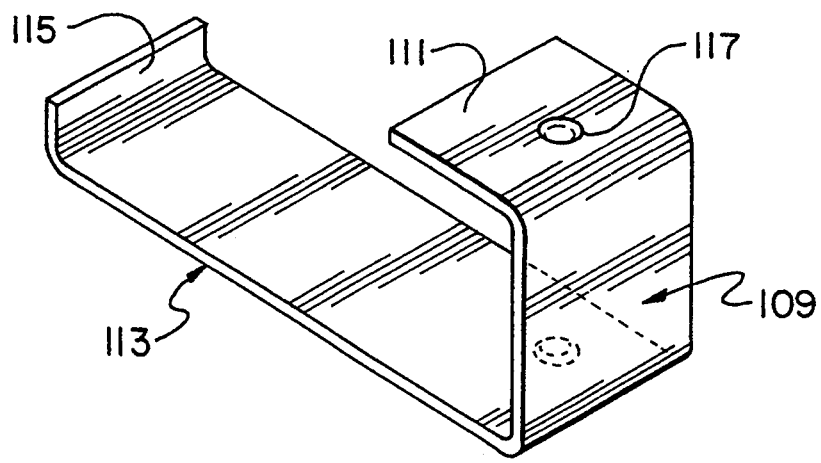
FIG. 2B is a top perspective view of a slidable contact of the embodiment of FIG. 2A.

A variable center tap, shown in FIGS. 1 and 2, permitting contact to be made to a manually selected point between opposite ends of region of resistive ink 103 is arranged as follows.

A C-shaped sliding contact 109 is fitted over edge 105 of substrate 101. One arm 111 of C-shaped sliding contact engages the surface of substrate 101 on which the region of resistive ink 103 is disposed (FIG. 1B). The other arm 113 of C-shaped sliding contact 109 engages the opposite surface of substrate 101 (FIG. 1A). One of the two aforementioned arms 111 and 113 of C-shaped sliding contact 109, in this embodiment arm 113, extends across the full width of the surface of substrate 101 to which it is adjacent. The end of extended arm 113 includes a bent end 115, for the purpose of retaining C-shaped sliding contact on substrate 101. Each arm 111 and 113 also have contact points 117 and 119, formed, for example, by stamping, so as to protrude slightly towards substrate 101. The region of substrate 101 over which contact point 119 may be moved is deposited with a metal region 121.

The dimensions of C-shaped sliding contact 109 and contact points 117 and 119 are selected so as to provide a tight but slidable coupling between C-shaped sliding contact 109 and substrate 101. Thus, good electrical contact to region of resistive ink 103 is made at contact point 117. Similarly, good electrical contact to metal region 121 is made at contact point 119. Desirable qualities of conductivity, dimensional stability and resilience may be achieved by constructing C-shaped sliding contact 109 of gold-plated beryllium copper. This choice of materials may be varied, particularly to maintain compatibility with a different material choice for metal regions 107. Such choices are common in the art.

Finally, connection from metal regions 107 and 121 to other circuit elements (not shown) in connection with which this device will be used is made through C-shaped end terminals 123 and C-shaped center terminal 125. C-shaped end terminals contacts may be most advantageously made of gold-plated, spring-tempered beryllium-copper or phosphor-bronze stampings. This construction gives them good conductivity and dimensional stability, along with strength for attachment to substrate 101. Again, different material choices above may result in different choices here.

As a result of the above configuration, a fixed resistance connects C-shaped end terminals 123 and a variable resistance connects the C-shaped center terminal 125 to each C-shaped end terminals 123.

There are a number of important circuits employing variable resistance elements. In some of these circuits, two such elements must have tapers which track in some predetermined fashion. Consider for example the T-pad attenuator circuit shown in FIG. 7. In such a circuit, the ganged, adjustable resistance elements should follow a predetermined, non-linear (for example, logarithmic) relationship with respect to each other, so as to provide satisfactory performance. This circuit will be discussed in further detail, below.

In considering the additional embodiments of the present invention such as are discussed below, or come to the minds of those skilled in the art, it should be borne in mind that the material choices discussed above apply equally to these embodiments.

Figure 3A:
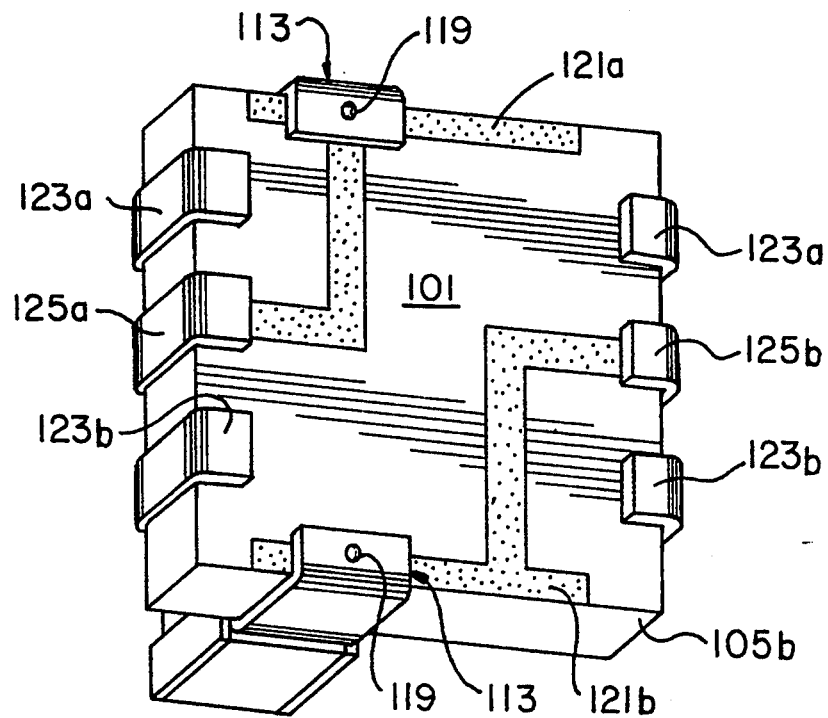
FIG. 3A is a perspective view of the top of another embodiment of the present invention.
Figure 3B:
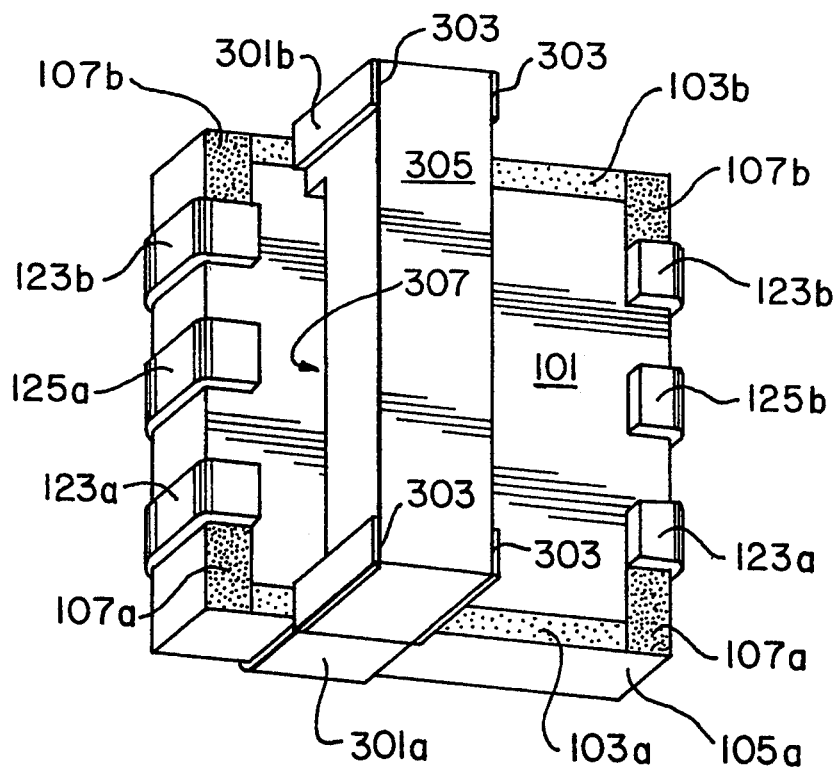
FIG. 3B is a perspective view of the bottom of another embodiment of the present invention.

A device having manual adjustability and good tracking characteristics between two variable resistance elements, may be constructed according to the present invention, as shown in the embodiment of FIGS. 3A and 3B. This embodiment is achieved essentially by the construction of two devices in accordance with the embodiment of FIGS. 1A and 1B, arranged on a single substrate 101, and in parallel along opposite edges of substrate 101. However, the C-shaped sliding contacts of this embodiment are somewhat different than that of the embodiment of FIGS. 1A and 1B, as will be explained below. In this embodiment, where features in common with the embodiment of FIGS. 1A and 1B have been duplicated so as to provide two variable resistance elements, they have been denoted by similar reference designations, having an appended "a" or "b" denoting which of two variable resistance elements with which they correspond.

As in the embodiment of FIGS. 1A and 1B, the embodiment of FIGS. 3A and 3B includes resistance elements comprising regions of resistive ink 103a and 103b, printed on one surface of substrate 101. Each region of resistive ink 103a and 103b is printed adjacent and parallel to a corresponding one of parallel edges 105a and 105b of substrate 101. Metal regions 107a and 107b on the same surface of substrate 101 make electrical contact to ends of corresponding regions of resistive ink 103a and 103b. Metal regions 121a and 121b on an opposite surface of the substrate 101 are provided adjacent edges 105a and 105b in regions over which C-shaped sliding contacts 301 will pass. As in the embodiment of FIGS. 1A and 1B, C-shaped end terminals 123a and 123b and C-shaped center terminal 125a and 125b are provided to form connections between other circuit elements (not shown) and metal regions 107a, 107b, 121a and 121b.

Figure 4:
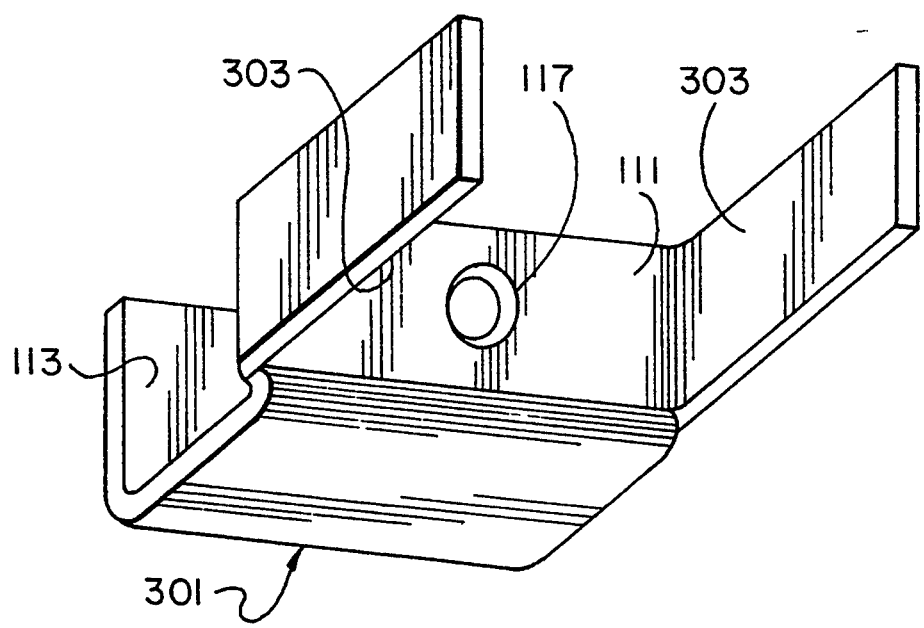
FIG. 4 is a perspective view of a slidable contact of the embodiment of FIG. 3A.

C-shaped sliding contacts 301a and 301b, shown in FIGS. 3A and 3B and 4, are each fitted over edges 105a and 105b of substrate 101. One arm 111 of each C-shaped sliding contact 301 engages the surface of substrate 101 on which the regions of resistive ink 103a and 103b are disposed. The other arm 113 of each C-shaped sliding contact 301 engages the opposite surface of substrate 101. Contact points 117 and 119 are formed in arms 111 and 113 respectively, for example by stamping, so as to protrude slightly towards substrate 101. Thus, by choice of the dimensions of C-shaped sliding contacts 301a and 301b and contact points 117 and 119 a tight but slidable coupling is achieved between each C-shaped sliding contact 301 and substrate 101. Therefore, good electrical contact to regions of resistive ink 103a and 103b are made at corresponding contact points 117. Also, good electrical contact is made to metal regions 121a and 121b at contact points 119.

C-shaped sliding contacts 301a and 301b further include extensions 303 for engaging a ceramic bar 305. Other materials may be substituted for ceramic bar 305, provided they are compatible with microwave applications, the construction techniques employed and the requirement of mechanical stability. Ceramic bar 305 mechanically couples the two C-shaped sliding contacts 301 together in opposed parallel facing relation, so as to keep them engaged with edges 105a and 105b of substrate 101. Furthermore, ceramic bar 305 maintains proper mechanical alignment between C-shaped sliding contact 301 during manual adjustment of their position.

In order to enhance the mechanical stability of this arrangement, an adhesive or glue suitable for attaching ceramic to metal may be applied between adjacent surfaces of arms 303 and ceramic bar 305. Any other means for securing C-shaped sliding contact 301 to ceramic bar 305, such as swaging may be used.

In order to maximize the range of physical adjustability, ceramic bar 305 includes a notch 307 which permits clearance for C-shaped end terminals 123 and C-shaped center terminals 125. Ceramic bar 305 could also be simply raised within arms 303 to provide such clearance.

Yet another embodiment of the present invention is now described in connection with FIGS. 5A, 5B, 6A, 6B, and 7. The mechanical configurations of FIGS. 5A and 5B and FIGS. 6A and 6B embody the circuit shown schematically in FIG. 7.

Figure 5A:
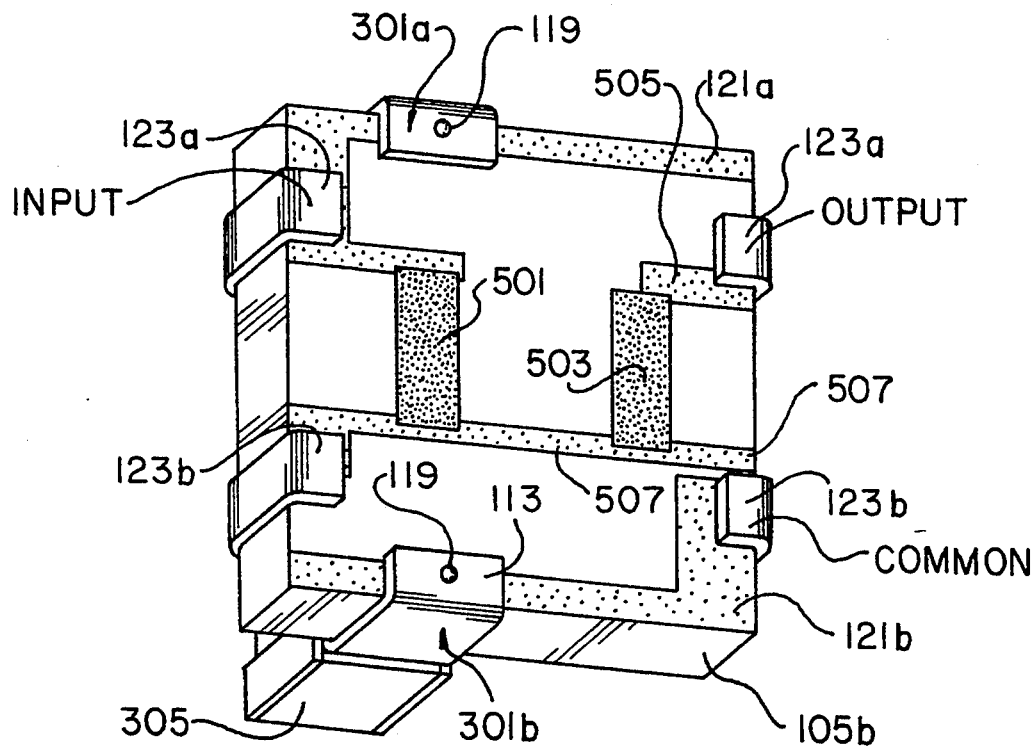
FIG. 5A is a perspective view of yet another embodiment of the present invention functioning as a T-pad attenuator.
Figure 5B:
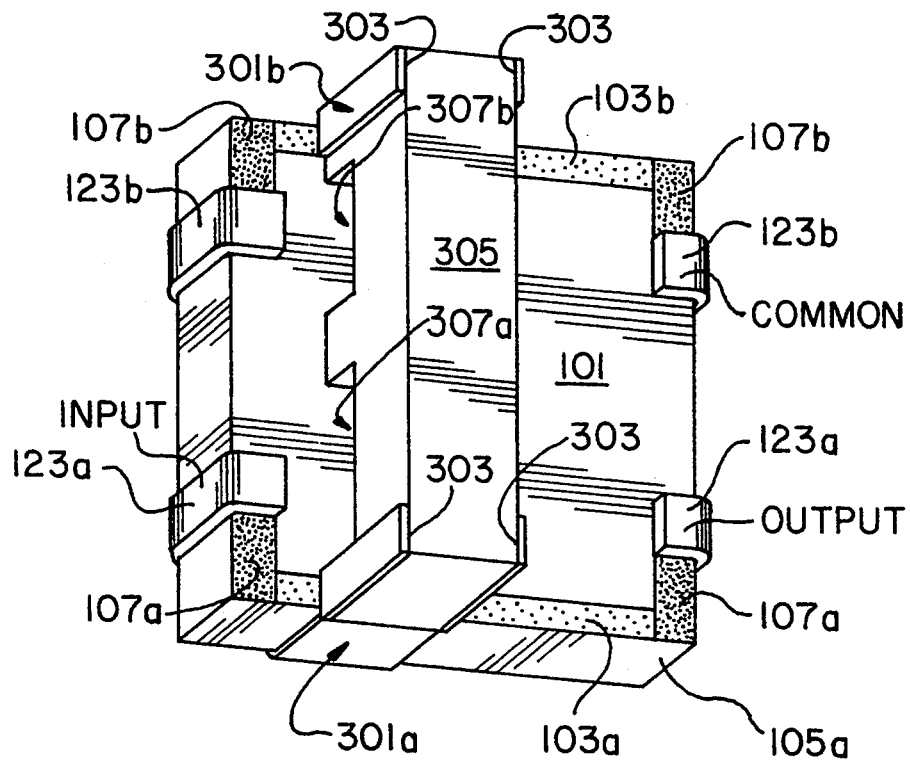
FIG. 5B is a perspective view of yet another embodiment of the present invention functioning as a T-pad attenuator.
Figure 6A:
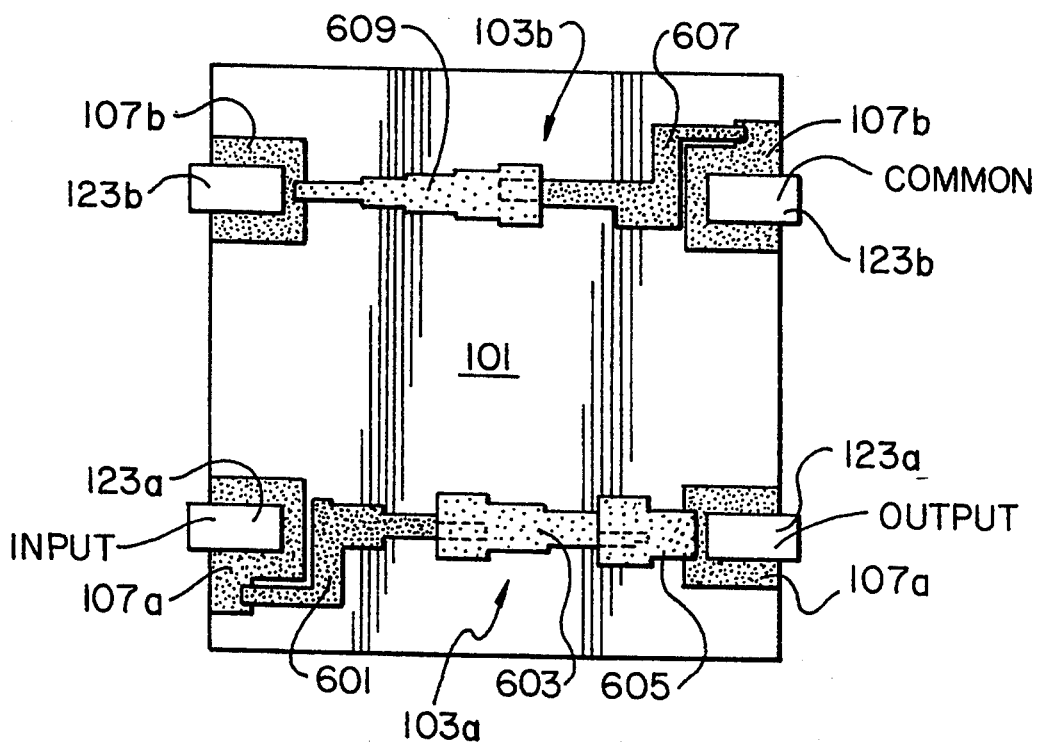
FIG. 6A is a plan view of the layout of elements of the substrate used in the embodiment of FIG. 5A.
Figure 6B:
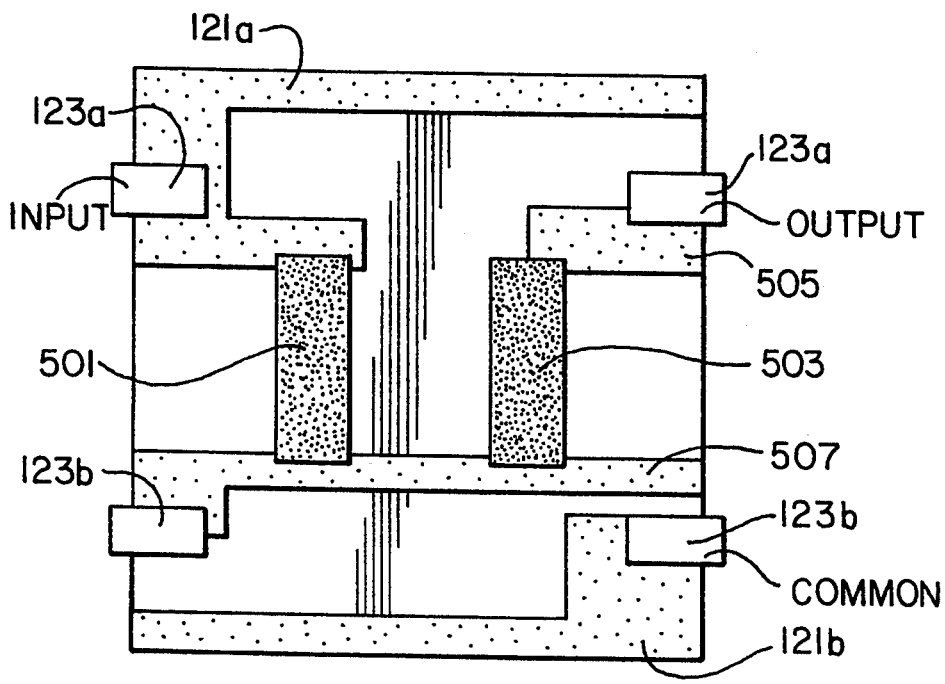
FIG. 6B is a plan view of the layout of elements of the substrate used in the embodiment of FIG. 5B.
Figure 7:
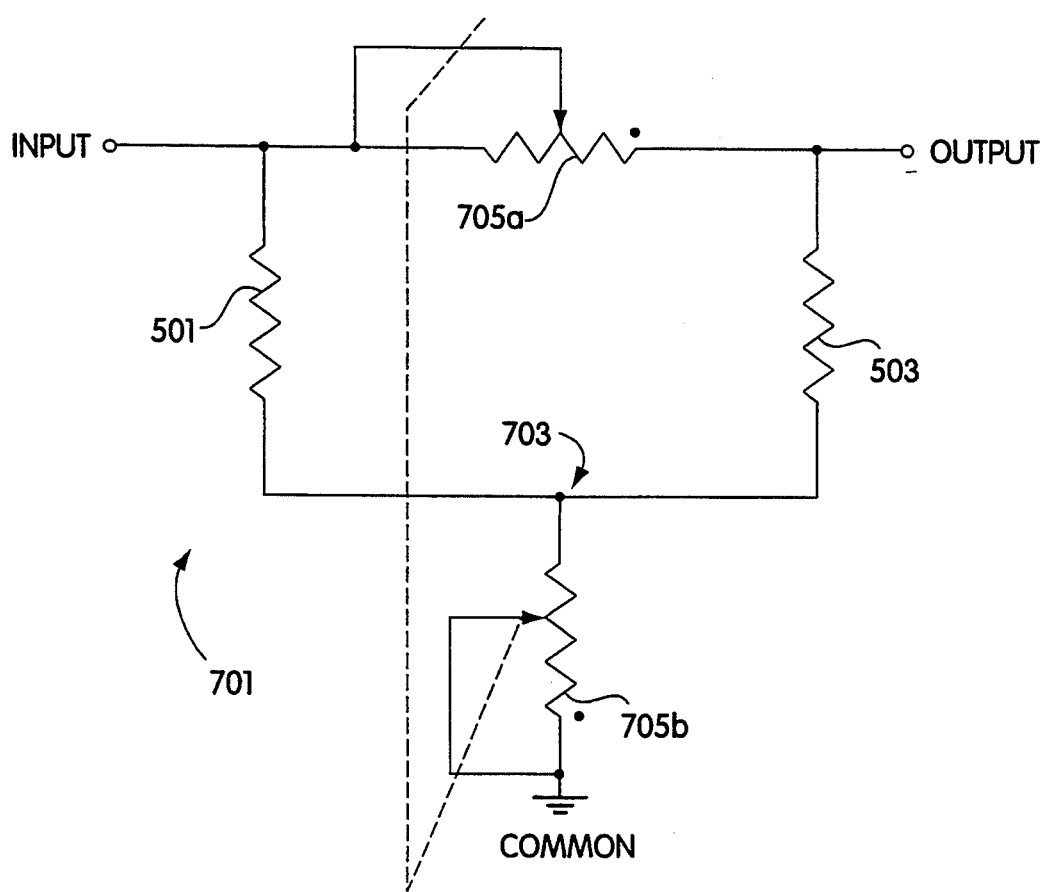
FIG. 7 is a schematic diagram of a T-pad attenuator circuit.

The structure of the embodiment of FIGS. 5A and 5B is substantially similar to that shown in FIGS. 3A and 3B. However, there are a number of differences between those embodiments, which give the embodiment of FIGS. 5A and 5B functionality as a T-pad attenuator. Notably, the T-pad attenuator is a two-port device having an input terminal, an output terminal and a common terminal. Thus, fewer C-shaped end terminals are used thereon. Also, this embodiment adds two resistors 501 and 503 electrically connected between regions of resistive inks 103a and 103b as shown in FIG. 7.

Referring to FIGS. 5A, 5B and FIGS. 6A and 6B, one C-shaped end contact 123a is designated an INPUT node, while the other C-shaped end terminal 123a is designated an OUTPUT node. Also, one C-shaped end terminal 123b is designated a COMMON, or ground node, while the other C-shaped end terminal 123b is simply an internally connected node, not normally connected to outside circuitry.

On one side of substrate 101, a number of connections are made as follows. C-shaped end terminal 123a designated INPUT is connected to metallic region 121a. Metallic region 121a connects INPUT C-shaped end terminal 123a to C-shaped slidable contact 301a and also to one end of resistor 501. Likewise, metallic region 505 connects OUTPUT C-Shaped end contact 123a to one end of resistor 503. A second end of resistor 501 is connected to a second end of resistor 503 by metallic region 507. Metallic region 507 is also, incidentally, connected to undesignated C-shaped end terminal 123b. Finally, COMMON C-shaped end terminal 123b is connected via metallic region 121b to C-shaped slidable contact 301b.

In this embodiment, ceramic bar 305 is provided with two clearance notches 307a and 307b.

As seen in FIG. 7, the connections described, in conjunction with regions of resistive ink 103a and 103b (FIG. 5B) form T-pad attenuator 701. T-pad attenuator 701 has INPUT, OUTPUT, and COMMON nodes as shown. Those are the external connections normally available in such a circuit. Resistor 501 is connected from the INPUT note to internal node 703. Likewise, resistor 503 is connected from the output node to internal node 703. One variable resistor 705a, corresponding to region of resistive ink 103a is connected between the input node and output node. Another variable resistor 705b is connected from internal node 703 to the COMMON node. Additional details concerning regions of resistive ink 103a and 103b, comprising variable resistors 705a and 705b respectively, are now described in connection with FIG. 6A.

Region of resistive ink 103a is a relatively high-value resistance, comprising three sub-regions 601, 603 and 605. Each of the three sub-regions 601, 603 and 605 is printed with a resistive ink having a different resistivity. For example, region 601 may be printed with ink having a resistivity of 2.5 $\Omega/\square$. Sub-region 603 may be printed with ink having a resistivity of 7.5 $\Omega/\square$ and sub-region 605 may be printed with an ink having resistivity 22.5 $\Omega/\square$. Each of sub-regions 601, 603 and 605 may be laser trimmed after printing, so as to provide a desired resistance profile along its length. In the case of this embodiment, it is desired that resistance increase logarithmically as one proceeds from the broad end of sub-region 601 to the narrow end of sub-region 605. Other embodiments may have a resistance profile which varies in a different non-linear fashion. Sub-region 601 includes an elongated path connecting it to metallic region 107a. Thus, variable resistance 705a has a logarithmic profile as it is adjusted from its minimum value to its maximum value, and has minimum and maximum values in a ratio of 1:100.

Variable resistor 705b corresponds to region of resistive ink 103b, comprising two sub-regions 607 and 609. In this embodiment, sub-region 607 may be printed using resistive ink having a resistivity of 2.5 $\Omega/\square$, while sub-region 609 is printed using resistive ink having a resistivity of 7.5 $\Omega/\square$. This construction will yield a relatively low resistance element also having a logarithmic taper and a minimum value to maximum value ratio of about 1:10. The precise taper of this element is adjusted by laser trimming, just as that of variable resistance 705a. Likewise, this element may have a different non-linear taper, if so desired.

Variations on the embodiments described above are possible. For example, the precise location of the resistive elements and conductive stripes may be varied. One variable resistive element can be placed on the top side of the substrate and the second resistive element can be placed on the bottom side of the substrate, with respective conductors placed on opposite sides of the substrate parallel to their associated resistor elements.

The present invention has now been described in connection with a number specific embodiments. The foregoing description is meant to suggest to those skilled in the art numerous variations, extensions and modifications also contemplated as falling within the scope of the present invention, which is intended to be limited only by the claims appended hereto.

What is claimed is:

1. A miniature potentiometer, comprising:
   a substrate;
   a resistor comprising a length of electrically resistive material having two ends and disposed on a first side of the substrate, parallel to a first edge of the substrate;
   a conductive stripe disposed on a second side of the substrate, parallel to the first edge;
   a plurality of C-shaped end terminals mechanically attached to the substrate and each electrically connected to the resistor: and
   a C-shaped sliding contact, slidably coupled to the substrate on the first edge so as to electrically connect a point along the resistor to a point along the conductive stripe.

2. A miniature potentiometer comprising:
   a substrate;
   a resistor comprising a length of electrically resistive material having two ends and disposed on a first side of the substrate, parallel to a first edge of the substrate;
   a conductive stripe disposed on a second side of the substrate, parallel to the first edge;
   a C-shaped sliding contact, slidably coupled to the substrate on the first edge so as to electrically connect a point along the resistor to a point along the conductive stripe; and
   the C-shaped sliding contact including an arm having a bent end, the bent end engaging a second edge of the substrate, parallel to the first edge, such that the C-shaped sliding contact is retained in engagement with the substrate.

3. A dual miniature potentiometer, comprising:
   a substrate;
   a pair of resistors, each disposed on a side of the substrate, and comprising a length of electrically resistive material having two ends, said resistors parallel to both each other and a first edge of the substrate;
   a pair of conductive stripes each disposed on an opposing side of the substrate relative to a corresponding one of the pair of resistors, parallel to both each other and the first edge of the substrate;
   a first C-shaped sliding contact, slidably coupled to the substrate along the first edge, so as to electrically connect a point along one of the pair of resistors to a point along one of the pair of conductive stripes;
   a second C-shaped sliding contact, slidably coupled to the substrate along a second edge, parallel to the first edge, so as to electrically connect a point along another of the pair of resistors to a pint along another of the pair of conductive stripes;
   an electrically insulating connecting bar for mechanically connecting the first and second C-shaped sliding contacts; and
   a plurality of C-shaped end terminals mechanically attached to the substrate and each electrically connected to at least one of the resistors.

4. A dual miniature potentiometer as recited in claim 3, further comprising:
   at least one C-shaped end terminal disposed at one end of the substrate and electrically connected to one end of one of the pair of resistors; and
   wherein a sufficient space is provided between a portion of the connecting bar and the substrate so as to avoid mechanical contact between the connecting bar and the end terminal.

5. A T-pad attenuator for microwave frequency application, comprising:
   a substrate;
   a first pair of resistors, each disposed on a first side of the substrate, and comprising a length of electrically resistive material having two ends, said resistors parallel to both each other and a first edge of the substrate;
   a pair of conductive stripes disposed on a second side of the substrate, parallel to both each other and the first edge of the substrate;
   a first C-shaped sliding contact, slidably coupled to the substrate along the first edge, so as to electrically connect a point along one of the first pair of resistors to a point along one of the pair of conductive stripes;
   a second C-shaped sliding contact, slidably coupled to the substrate along a second edge, parallel to the first edge, so as to electrically connect a point along another of the first pair of resistors to a point along another of the pair of conductive stripes;

an electrically insulating connecting bar for mechanically connecting the first and second C-shaped sliding contacts;

a second pair of resistors, each having one end electrically connected to opposite ends of one of the first pair of resistors, and each having another end electrically connected together and also electrically connected to one end of another of the first pair of resistors; and a plurality of C-shaped end terminals mechanically attached to the substrate and each electrically connected to at least one of the first pair of resistors.

6. A T-pad attenuator as recited in claim 5, wherein one of the first pair of resistors further comprises:

a first region of resistive ink trimmed so as to provide a non-linear resistance taper between two end of the region.

7. A T-pad attenuator as recited in claim 6, wherein another of the first pair of resistor further comprises:

a second region of resistive ink trimmed so as to provide a non-linear resistance taper between two ends of the region.

8. A T-pad attenuator as recited in claim 6, wherein the first region of resistive ink further comprises:

a plurality of sub-regions including a plurality of resistive inks of differing resistivities.

9. A T-pad attenuator as recited in claim 6, wherein the first region of resistive ink is trimmed so as to have a logarithmic resistance taper.

10. A T-pad attenuator as recited in claim 9, wherein another of the first pair of resistors further comprises:

a second region of resistive ink having a width trimmed so as to provide a logarithmic resistance taper between two ends of the region and running in a direction opposite the taper of the first region.

11. A T-pad attenuator as recited in claim 5, wherein the substrate has dimensions substantially 0.3 inches×0.3 inches×0.02 inches.

* * * * *